United States Patent
Balogh

[11] Patent Number: 6,144,245
[45] Date of Patent: Nov. 7, 2000

[54] ADAPTIVE LEADING EDGE BLANKING CIRCUIT TO ELIMINATE SPIKE ON POWER SWITCHING TRANSISTOR CURRENT SENSE SIGNAL

[75] Inventor: Laszlo Balogh, Merrimack, N.H.

[73] Assignee: Unitrode Corporation, Merrimack, N.H.

[21] Appl. No.: 09/106,368

[22] Filed: Jun. 29, 1998

[51] Int. Cl.[7] .................................................. H03K 17/16
[52] U.S. Cl. ...................... 327/380; 327/322; 327/538; 323/282
[58] Field of Search ................................... 327/379–381, 327/77, 387, 54, 50, 51, 538, 543, 322; 361/152, 154, 18; 323/284, 282, 285, 286

[56] References Cited

U.S. PATENT DOCUMENTS

| | | | |
|---|---|---|---|
| 4,438,473 | 3/1984 | Cawley et al. | 361/18 |
| 4,453,194 | 6/1984 | Frankeny et al. | 361/154 |
| 4,485,455 | 11/1984 | Boone et al. | 708/130 |
| 4,724,363 | 2/1988 | Buer | 315/307 |
| 4,952,853 | 8/1990 | Archer | 318/284 |
| 4,959,606 | 9/1990 | Forge | 323/286 |
| 4,988,939 | 1/1991 | Reichard et al. | 318/800 |
| 5,305,192 | 4/1994 | Bonte et al. | 363/21 |
| 5,315,498 | 5/1994 | Berrios et al. | 363/98 |
| 5,418,410 | 5/1995 | Tisinger | 327/77 |
| 5,423,192 | 6/1995 | Young et al. | 62/228.4 |
| 5,438,499 | 8/1995 | Bonte | 363/21 |
| 5,469,029 | 11/1995 | Jackson et al. | 315/408 |
| 5,491,978 | 2/1996 | Young et al. | 62/126 |
| 5,492,273 | 2/1996 | Shah | 236/44 A |
| 5,502,370 | 3/1996 | Hall et al. | 323/284 |
| 5,592,058 | 1/1997 | Archer et al. | 318/254 |

OTHER PUBLICATIONS

F.J.DE Stasi et al., "A monolithic boost converter for telecom applications", *IEEE*, pp 360–368; 1993.

*Primary Examiner*—Timothy P. Callahan
*Assistant Examiner*—Minh Nguyen
*Attorney, Agent, or Firm*—Weingarten, Schurgin, Gagnebin & Hayes LLP

[57] ABSTRACT

Leading-edge blanking circuits blank the leading edge of a current sense signal generated by sensing circuitry sensing the current through a switching field-effect transistor. A current sensor is employed to sense the magnitude of gate current being provided to the gate of the switching transistor by a driver circuit. A comparator indicates whether the sensed magnitude of the gate current exceeds a predetermined threshold current. A blanking circuit component, such as a transistor connected to ground, is also used. In one blanking circuit, the blanking component forces the current sense signal to zero when the comparator indicates that the gate current of the switching transistor exceeds the threshold current, and otherwise allows the value of the current sense signal to be determined by the current-sensing circuitry. In another blanking circuit, a latch is interposed between the comparator and the blanking component. The latch generates a blanking control signal to control the blanking component. The blanking control signal becomes asserted upon the assertion of a switching-control signal that controls the driver circuit, and becomes deasserted when the comparator indicates that the gate current of the switching transistor has diminished to below the threshold current. In both circuits the blanking interval ends when the gate current has sufficiently diminished, indicating that the initial spike in the switching transistor current has subsided.

4 Claims, 2 Drawing Sheets

ADAPTIVE LEADING EDGE BLANKING CIRCUIT TO ELIMINATE SPIKE ON POWER SWITCHING TRANSISTOR CURRENT SENSE SIGNAL

CROSS REFERENCE TO RELATED APPLICATIONS

None

STATEMENT REGARDING FEDERALLY SPONSORED RESEARCH OR DEVELOPMENT

Not Applicable

BACKGROUND OF THE INVENTION

The present invention is related to the field of DC power supply circuits, and more particularly to circuits such as switching power supplies that employ power switching transistors.

In switching power supplies and other circuits employing power switching transistors, it is common for the operation of the circuit to depend in some manner on the amount of current flowing through a switching transistor. For example, most switching power supplies have protection circuitry that shuts the switching transistor off if it is conducting an excessive amount of current, to prevent the transistor from being damaged. This situation might arise, for example, if the output of the power supply is inadvertently short-circuited. The current being conducted by the transistor is sensed in some fashion, and a current sense signal indicating the magnitude of the current in the transistor is provided to the protection circuitry. Typically the protection circuitry compares the current sense signal with a reference signal indicating the maximum permissible current, and shuts off the transistor if the comparison indicates that the maximum permissible current is being exceeded.

One common problem in circuits that rely on a current sense signal from a switching transistor is the possibility of "false alarms", or conditions in which the current sense signal indicates that excessive current is being conducted but it is undesirable for the circuitry using the current sense signal to respond. A well-known example of such a condition occurs during a short interval after a switching transistor switches on, referred to as the "leading edge" of the current sense signal. For any of a variety of well-known reasons, the current through the transistor rises, or "spikes", to a very large value before returning to a more slowly-varying level as determined by the surrounding circuit. It is undesirable for protection circuitry to shut off the transistor under such transient conditions.

This problem of a leading-edge spike on the current sense signal has been addressed in prior switching power supplies by a variety of special spike-suppression circuits. One general class of spike-suppression circuits are referred to as "leading edge blanking" circuits. These circuits are activated just prior to the time that the switching transistor is turned on, and operate to override or "blank" the current sense signal during a brief blanking interval after the switching transistor is turned on. For example, the circuit node on which the current sense signal appears may be temporarily shorted to ground through a pulldown transistor. The protection or other circuitry using the current sense signal does not receive the transient spike, and therefore as is desired the circuitry does not respond during the blanking interval.

One approach to leading edge blanking has been to employ a one-shot timer. The timer is triggered at the same time that the switching transistor is turning on, and it provides a pulse of predetermined duration that is used to blank the current sense signal. This approach suffers some drawbacks that make it unattractive in many cases. The fixed blanking period set by the timer limits the frequency range over which the switching circuitry may be used. This fixed limit is problematic if the control circuitry for the switching transistor is intended to be used in a variety of different power supply circuits. Also, the limited accuracy of the timing circuit when combined with worst-case design constraints requires that the nominal blanking interval be larger than that required to effectively override the leading-edge spike, in order to accommodate production tolerances of component values. This requirement likewise may unnecessarily limit the range of applications of the circuit.

Another known approach to leading edge blanking is described, for example, in U.S. Pat. No. 5,418,410 to Eric Tisinger, entitled "Leading Edge Blanking Circuit". The blanking circuit in the Tisinger patent monitors the gate voltage of a MOS switching transistor connected between an output node and ground. A predetermined threshold level is established that is between a "plateau" gate voltage, reached early during the transistor's switching, and a final gate voltage reached when the transistor has completely switched. When the gate voltage exceeds the threshold level, the current spike has substantially subsided. The circuit operates by blanking the leading edge of the current sense signal until the gate voltage exceeds the threshold level. Because the circuit's operation is responsive to the operation of the actual switching device in the power supply rather than operating in a predetermined fixed manner, the blanking circuit is an example of "adaptive" leading edge blanking.

Adaptive leading edge blanking is in general a superior solution to the current spike problem, because it enables a blanking circuit to be used effectively despite variations in the characteristics of the switching transistor or other circuit components. However, the technique of monitoring gate voltage illustrated in the Tisinger patent does not provide adequate blanking when the actual gate voltage of the switching transistor cannot be monitored. This situation exists, for example, when the switching transistor is housed in a separate integrated circuit package from the blanking circuitry. In such a case there is series gate resistance existing in the gate drive path, between the circuit node at which the gate voltage is sensed and the actual gate of the switching transistor. In some cases a series resistor may be purposely placed in this path to accomplish other design goals; in other cases the series resistance may be an uncontrollable parasitic resistance arising from the packaging or circuit layout of the switching transistor. When series resistance is present, the real gate voltage of the switching transistor always lags behind the voltage used by the blanking circuitry. Thus blanking circuitry like that shown in the Tisinger patent is prone to terminate blanking prematurely, in which case erroneous operation of the circuitry using the current sense signal may result.

It is desirable to employ adaptive leading edge blanking of a current sense signal such that accurate blanking is achieved despite the existence of series gate resistance or other parasitics in the gate drive path of a switching transistor.

BRIEF SUMMARY OF THE INVENTION

In accordance with the present invention, adaptive leading edge blanking circuits for use with switching-transistor current sensing circuitry are disclosed which operate accurately despite the presence of series resistance or other parasitics in the gate drive path of the switching transistor. The circuits are fully adaptive to the parameters of the switching transistor and the characteristics of the power circuitry with which the circuits are used. The circuits do not employ a timing circuit or a voltage monitoring circuit, and thus do not suffer the associated drawbacks as discussed above.

In the disclosed blanking circuits, a current sensor is employed to sense the magnitude of gate current being provided to the gate of the switching transistor by a driver circuit. A comparator indicates whether the sensed magnitude of the gate current exceeds a predetermined threshold current. Another circuit component, such as a transistor connected to ground, is a blanking component that blanks the current sense signal.

In one disclosed blanking circuit, the blanking component blanks the current sense signal when the comparator indicates that the gate current of the switching transistor exceeds the threshold current. The blanking component otherwise allows the value of the current sense signal to be determined by the current-sensing circuitry.

In another disclosed blanking circuit, a latch is interposed between the comparator and the blanking component. The latch generates a blanking control signal that controls the blanking component. The blanking control signal becomes asserted upon the assertion of a switching-control signal that controls the driver circuit, and it becomes deasserted when the comparator indicates that the gate current of the switching transistor has diminished to below the threshold current. Thus in the disclosed circuits the blanking interval ends when the gate current has sufficiently diminished, indicating that the initial spike in the switching transistor current has subsided.

Because the blanking interval is terminated based on the gate current of the switching transistor, the circuits are fully adaptive to the switching circuitry and thus can be used effectively under a variety of varying conditions. Moreover, the circuits do not suffer the timing inaccuracy of prior circuits that attempt to sense gate voltage to determine the end of the blanking interval.

Other aspects, features, and advantages of the present invention are disclosed in the detailed description which follows.

DETAILED DESCRIPTION OF THE INVENTION

The present invention takes advantage of the fact that during the turn-on process of the switching transistor, the gate current flowing into the gate of the switching transistor from the driver circuit is proportional to the voltage of the gate. A blanking circuit according to the present invention monitors the gate current and uses it to represent the actual gate voltage. A signal indicating the magnitude of the gate current is compared with a threshold signal representing a predetermined threshold gate current, and the comparison is used to terminate the blanking interval.

Figure 1:
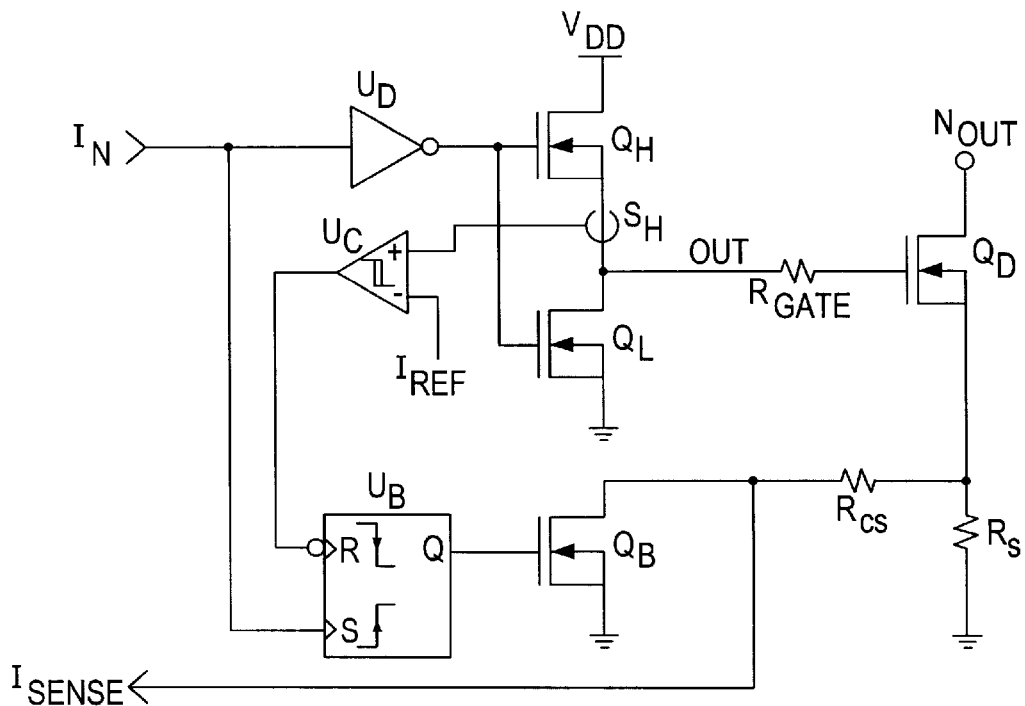
FIG. 1 is a schematic diagram of a first adaptive leading edge blanking circuit according to the present invention.

An example of this technique is illustrated in FIG. 1. The transistor $Q_D$ is a power switching transistor effective to switch a large current between a circuit node $N_{OUT}$ and ground. A sense resistor $R_S$ is used in conjunction with resistor $R_{CS}$ to develop a current sense signal ISENSE for use by control circuitry not shown in FIG. 1. This circuitry may be, for example, pulse-width modulator circuitry used to control the switching of transistor $Q_D$ via an input signal IN, as is known in the art.

The switching transistor $Q_D$ is controlled by driver circuitry including an inverting amplifier $U_D$, a high-side transistor $Q_H$, and a low-side transistor $Q_L$. A resistor $R_{GATE}$ is shown in the path between the driver circuit and the gate of transistor $Q_D$. The resistor $R_{GATE}$ represents the cumulative series resistance in the gate drive path, which as discussed above may include designed-for resistances as well as parasitic resistances.

A blanking transistor $Q_B$ is connected between ground and the signal ISENSE. The transistor $Q_B$ is controlled by the Q output of a latch $U_B$. The edge-sensitive SET input of the latch $U_B$ is connected to the input signal IN. The edge-sensitive RESET input of the latch $U_B$ is connected to the output of a comparator $U_C$. The comparator $U_C$ receives as inputs a signal IREF and the output of a current sensor $S_H$ coupled to the current path between the high-side transistor $Q_H$ and the switching transistor $Q_D$. The comparator $U_C$ preferably has hysteresis inputs to reduce the effects of noise. The signal IREF establishes the threshold gate current at which blanking is terminated.

The current sensor $S_H$ can be realized in a variety of ways, including the use of a sense resistor or resistive etch, a magnetic sensor such as a transformer or Hall effect device, scaled current mirrors, or the Kelvin output of a sensing field-effect transistor (FET).

Figure 2:
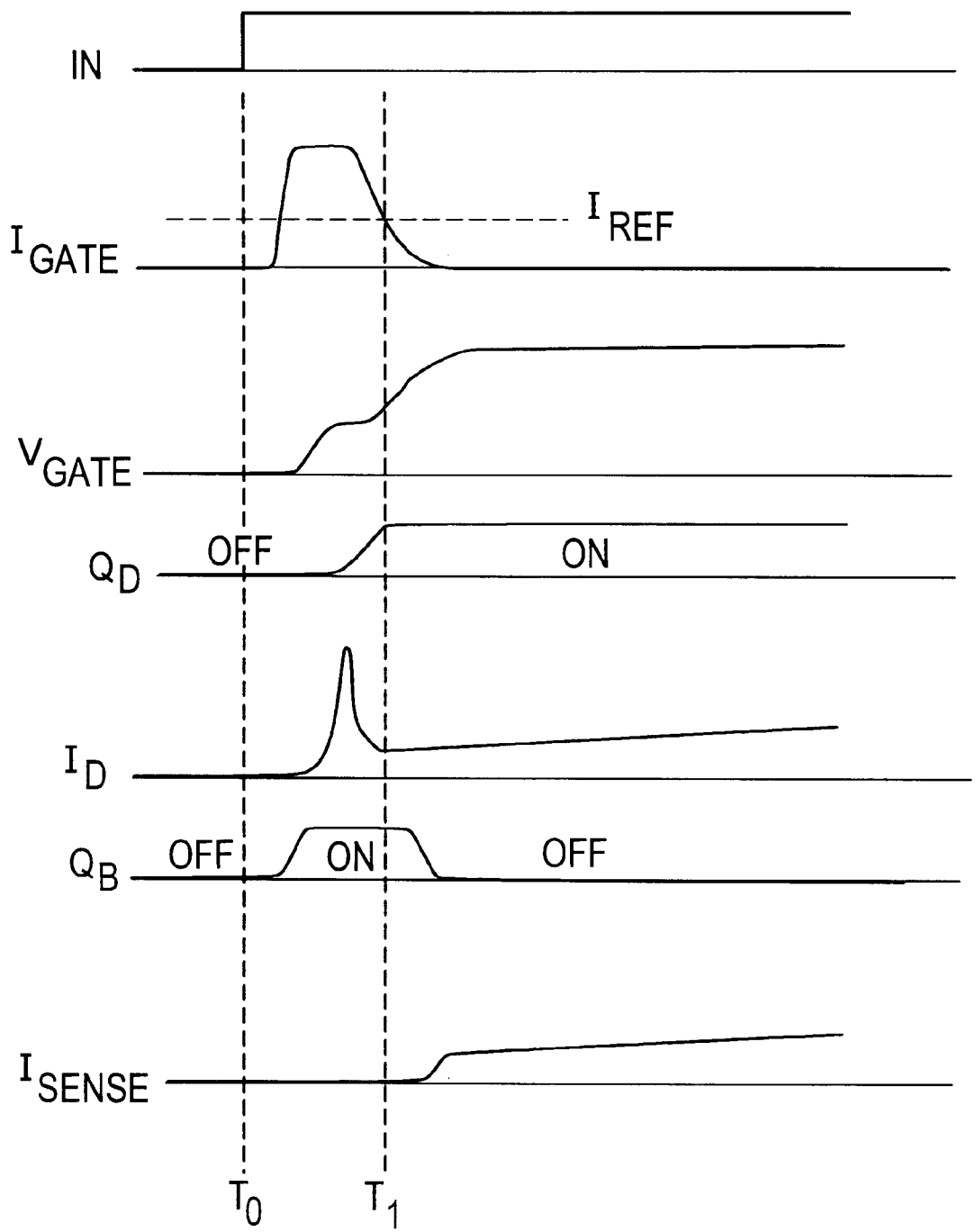
FIG. 2 is a timing diagram of several signals appearing in the blanking circuit of FIG. 1.

The operation of the blanking circuit of FIG. 1 is described with reference to the schematic diagram of FIG. 1 and the timing diagram of FIG. 2. It is assumed that the switching transistor $Q_D$ is initially OFF, so that the current sense signal ISENSE is low. At time $T_0$, the input signal IN switches high. This causes the Q output of the latch $U_B$ to become high, which turns on the blanking transistor $Q_B$, thus forcing the signal ISENSE to remain low. This is the beginning of the blanking interval.

The gate current $I_{GATE}$ becomes a high value and begins charging the gate of the switching transistor $Q_D$. This high gate current causes the output of the sensor $S_H$ to increase correspondingly, which in turn causes the output of the comparator $U_C$ to go high.

As the gate voltage $V_{GATE}$ rises, the source-to-drain current $I_D$ through the transistor $Q_D$ spikes to a large value. As shown, the voltage $V_{GATE}$ plateaus during the spike and then resumes its increase. As the spike subsides beginning about time $T_1$, the gate voltage $V_{GATE}$ has reached a sufficiently high value to cause the gate current $I_{GATE}$ to diminish below the threshold IREF. The output of the comparator $U_C$ then goes low, causing the output of the latch $U_B$ to also go low. The blanking transistor $Q_B$ is thus turned off, and the ISENSE signal takes on a value representing the current through the sense resistor $R_S$.

As will be appreciated, it is important that the current threshold signal IREF be chosen such that blanking is terminated after the voltage $V_{GATE}$ on the gate of the switching transistor $Q_D$ rises above the plateau voltage. This requirement is relatively easy to satisfy, however, because of the dramatic difference between the initial and final values of the gate current $I_{GATE}$. The initial value of the gate current IGATE may be on the order of Amperes, whereas the final value is on the order of milliAmperes. So the technique has a fairly large tolerance for variation of the signal IREF.

Figure 3:
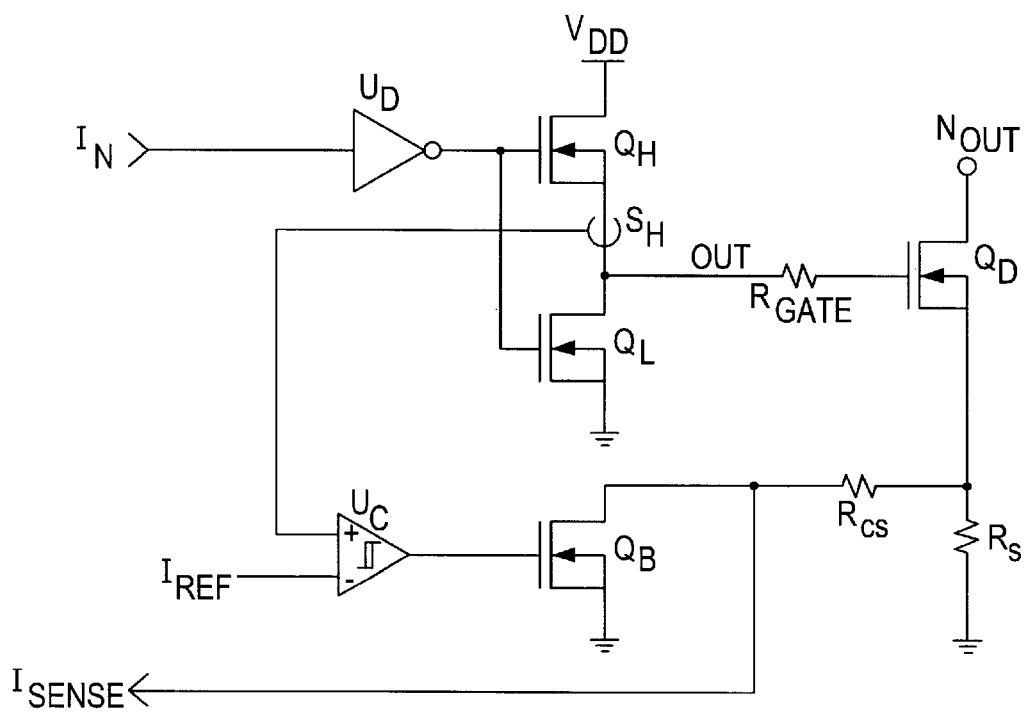
FIG. 3 is a schematic diagram of a second adaptive leading edge blanking circuit according to the present invention.

FIG. 3 shows an alternative leading-edge blanking circuit. The circuit is similar in most respects to the circuit of FIG. 1, but relies directly on the output of the comparator $U_C$ to control the blanking transistor $Q_B$. This configuration has the effect of shifting the blanking interval slightly later in time, especially the leading edge. For some applications the simpler configuration of FIG. 3 may be adequate. In other applications it may be important that the blanking transistor $Q_B$ be turned on as early as possible, in which case the circuit of FIG. 1, which uses the input signal IN for this purpose, is preferred.

The transistor $Q_B$ serves as the blanking component in the circuits of FIGS. 1 and 3, but in alternative circuits the blanking component may be a different device or subcircuit. One ready alternative is an analog switch connected between the ISENSE signal and a pulldown resistor to ground.

An improved leading-edge blanking circuit has been described that effectively blanks the leading edge of a current sense signal generated by sensing circuitry sensing the current through a switching field-effect transistor. It will be apparent to those skilled in the art that modification to and variation of the circuit are possible without departing from the inventive concepts disclosed herein. Accordingly, the invention should be viewed as limited solely by the scope and spirit of the appended claims.

What is claimed is:

1. A leading edge blanking circuit for blanking the leading edge of a current sense signal, the current sense signal being generated by sensing circuitry sensing current through a switching field-effect transistor, comprising:
    a sensor operative to sense the magnitude of gate current being provided to the gate of the switching transistor by a driver circuit;
    a comparator operative to indicate whether the sensed magnitude of the gate current exceeds a predetermined threshold current; and
    a blanking component operative to force the current sense signal to substantially zero when the comparator indicates that the gate current of the switching transistor exceeds the threshold current, and to allow the value of the current sense signal to be determined by the current-sensing circuitry when the comparator indicates that the gate current of the switching transistor does not exceed the threshold current.

2. A circuit according to claim 1, wherein the blanking component is a blanking transistor connected as a switch between an output of the sensing circuitry on which the current sense signal appears and ground, the blanking transistor being in a conducting state when the comparator indicates that the gate current of the switching transistor exceeds the threshold current, and the blanking transistor being in a non-conducting state when the comparator indicates that the gate current of the switching transistor does not exceed the threshold current.

3. A leading edge blanking circuit for blanking the leading edge of a current sense signal, the current sense signal being generated by sensing circuitry sensing current through a switching field-effect transistor, comprising:
    a driver circuit operative to provide gate current to the gate of the switching transistor in response to the assertion of a switching-control signal;
    a sensor operative to sense the magnitude of the gate current being provided to the gate of the switching transistor by the driver circuit;
    a comparator operative to indicate whether the sensed magnitude of the gate current exceeds a predetermined threshold current;
    a latch operative to assert a blanking control signal upon the assertion of the switching-control signal and to deassert the blanking control signal upon an indication by the comparator that the gate current has diminished to a value less than the predetermined threshold current; and
    a blanking component operative to force the current sense signal to substantially zero when the blanking control signal is asserted, and to allow the value of the current sense signal to be determined by the current-sensing circuitry when the blanking control signal is deasserted.

4. A circuit according to claim 3, wherein the blanking component is a blanking transistor connected as a switch between an output of the sensing circuitry on which the current sense signal appears and ground, the blanking transistor being controlled by the blanking control signal such that the blanking transistor is in a conducting state when the blanking control signal is asserted and the blanking transistor is in a non-conducting state when the blanking signal is deasserted.

* * * * *